US006370062B2

(12) United States Patent
Choi

(10) Patent No.: US 6,370,062 B2
(45) Date of Patent: Apr. 9, 2002

(54) NAND-TYPE FLASH MEMORY DEVICE AND METHOD OF OPERATING THE SAME

(75) Inventor: Jung-dal Choi, Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/733,255

(22) Filed: Dec. 8, 2000

(30) Foreign Application Priority Data

Dec. 10, 1999 (KR) .............................................. 99-56569

(51) Int. Cl.[7] .......................... G11C 16/06; G11C 16/04
(52) U.S. Cl. ............................. 365/185.23; 365/185.11; 365/185.17; 365/185.28
(58) Field of Search ........................ 365/185.17, 185.18, 365/185.23, 185.28, 185.29, 185.11

(56) References Cited

U.S. PATENT DOCUMENTS 5,615,163 A * 3/1997 Sakui et al. ............ 365/230.03
5,748,545 A * 5/1998 Lee et al. .................... 365/201
6,236,594 B1 * 5/2001 Kwon .................... 365/185.11

OTHER PUBLICATIONS

Kang–Deog Suh, et. al. "A 3.3V 32 Mb NAND Flash memory with Incremental Step Pulse Programming Scheme," ISSC Digest of Technical Papers, pp. 128–129, 1995.

Tae–Sung Jung, et al. "A 3.3V 128 Mb Multi–Level NAND Flash Memory for Mass Storage Applications," ISSC Digest of Technical Papers, pp. 32–33, 1996.

* cited by examiner

Primary Examiner—Son Mai
(74) Attorney, Agent, or Firm—Mills & Onello LLP

(57) ABSTRACT

A NAND-type flash memory device and a method of operating the same are provided. The NAND-type flash memory device includes a cell array area, which is composed of a plurality of cell blocks sharing m bit lines, and a row decoder driving the cell array area. Each of the cell blocks includes a string select line, n word lines and a ground select line which cross the m bit lines. The row decoder includes a plurality of block drivers connected to the plurality of cell blocks, respectively. Each of the block drivers includes a first group of word driver transistors, which are connected to the odd numbered word lines, respectively, and a second group of word driver transistors, which are connected to the even numbered word lines, respectively. The gate electrodes of the word driver transistors in the first group are connected to a first driver control line, and the gate electrodes of the word driver transistors in the second group are connected to a second driver control line. In selectively programming a certain cell transistor in the cell array area, a first voltage higher than a program voltage is applied to one driver control line, which controls a word driver transistor connected to a selected cell transistor, among the first and second driver control lines, and a second voltage which is higher than a pass voltage and lower than the program voltage is applied to the other driver control line.

13 Claims, 8 Drawing Sheets

NAND-TYPE FLASH MEMORY DEVICE AND METHOD OF OPERATING THE SAME

BACKGROUND OF THE INVENTION

1. Field of the Invention

The present invention relates to a semiconductor device and a method of operating the same, and more particularly, to a NAND-type flash memory device and a method of operating the same.

2. Description of the Related Art

Flash memory devices maintain information stored in their memory cells even if their power supply is interrupted. Therefore, flash memory devices are widely used in computers and memory cards.

Flash memory devices are classified as NOR-type flash memory devices and NAND-type flash memory devices. NOR-type flash memory devices have a high sensing margin because they can obtain larger cell current than NAND-type flash memory devices, but they have low integration density. Accordingly, NAND-type flash memory devices are widely used when high integration density is required.

FIG. 1 is a block diagram of a typical NAND-type flash memory device.

Referring to FIG. 1, the NAND-type flash memory device includes a cell array area (C/A) 100 in which a plurality of memory cell transistors are arranged in a matrix. A row decoder (R/D) 300 and a column decoder (C/D) 500, which operate the plurality of memory cell transistors, are disposed around the C/A 100. The C/D 500 includes a sense amplifier (S/A) for amplifying a signal output from the C/A 100. The R/D 300 and the C/D 500 are controlled by an input/output unit (I/O) 700. The I/O 700 processes signals received via a plurality of pads and determines the operation mode, for example, a program mode, an erase mode or a read mode, of the flash memory device. The I/O 700 also outputs signals for selecting desired cells or blocks within the C/A 100. The signals output from the I/O 700 are converted into signals for selecting desired cells or blocks within the C/A 100 by the R/D 300 and the C/D 500. The I/O 700 also has a function of outputting cell information, which is amplified by the S/A in a read mode, to the outside.

FIG. 2 is a circuit diagram partially showing a row decoder and a cell array area, which construct a conventional NAND-type flash memory device. Referring to FIG. 2, a cell array area 100a is composed of a plurality of cell blocks, and each cell block includes a plurality of strings, i.e., m strings S1 through Sm. Each string is interposed between a single bit line BL and a common source line CS. For example, a first string S1 is interposed between a first bit line BL1 and the common source line CS, and an m-th string Sm is interposed between an m-th bit line BLm and the common source line CS. A single string is composed of a single string select transistor SST, a plurality of cell transistors C and a single ground select transistor GST. For example, the first string S1 is composed of a first string select transistor SST1, a first ground select transistor GST1 and n cell transistors C11, C12, C13, . . . , and C1n, which are connected in series between the first string select transistor SST1 and the first ground select transistor GST1. The first string select transistor SST1 is connected to the first bit line BL1, and the first ground select transistor GST1 is connected to the common source line CS. Similarly, the m-th string Sm is composed of an m-th string select transistor SSTm, an m-th ground select transistor GSTm and n cell transistors Cm1, Cm2, Cm3, . . . , and Cmn, which are connected in series between the m-th string select transistor SSTm and the m-th ground select transistor GSTm. The m-th string select transistor SSTm is connected to the m-th bit line BLm, and the m-th ground select transistor GSTm is connected to the common source line CS.

A cell block constructed by the m strings S1 through Sm includes a single string select line SSL, n word lines WL1, WL2, WL3, . . . , and WLn and a single ground select line GSL. The string select line SSL is connected to the gate electrodes of the first through m-th string select transistors SST1 through SSTm. The ground select line GSL is connected to the gate electrodes of the first through m-th ground select transistors GST1 through GSTm. The first word line WL1 is connected to the control gate electrodes of the first cell transistors C11 through Cm1 of the respective strings S1 through Sm. The second word line WL2 is connected to the control gate electrodes of the second cell transistors C12 through Cm2 of the respective strings S1 through Sm. Similarly, the third word line WL3 is connected to the control gate electrodes of the third cell transistors C13 through Cm3, and the n-th word line WLn is connected to the control gate electrode of the n-th cell transistors C1n through Cmn of the respective strings S1 through Sm.

A conventional row decoder 300a includes a single string control line SCL, n word control lines W1, W2, W3, . . . , and Wn, a single ground control line GCL and a plurality of block drivers. A single block driver controls only one cell block. For example, a block driver 310 controls only one cell block which is composed of the first through m-th strings S1 through Sm. The block driver 310 is composed of a single string driver transistor SDT, n word driver transistors WDT1 through WDTn and a single ground driver transistor GDT. The string driver transistor SDT is interposed between the string control line SCL and the string select line SSL, and the ground driver transistor GDT is interposed between the ground control line GCL and the ground select line GSL. The first word driver transistor WDT1 is interposed between the first word control line W1 and the first word line WL1, and the second word driver transistor WDT2 is interposed between the second word control line W2 and the second word line WL2. Similarly, the third word driver transistor WDT3 is interposed between the third word control line W3 and the third word line WL3, and the n-th word driver transistor WDTn is interposed between the n-th word control line Wn and the n-th word line WLn. The block driver 310 also includes a single driver control line DCL which is connected to the gate electrodes of the string driver transistor SDT, the n word driver transistors WDT1 through WDTn and the ground driver transistor GDT.

The following description concerns a method of operating the conventional NAND-type flash memory device of FIG. 2.

When a desired cell transistor, for example, the second cell transistor C12 of the first string S1, in the cell array area 100a is intended to be selectively programmed, a voltage of 0 volts is applied to a semiconductor substrate with the cell array area 100a, that is, to the bulk areas of the cell transistors and the common source line CS. In addition, a voltage of 0 volts is applied to the first bit line BL1 connected to the first string S1 and the ground control line GCL. In this case, a program inhibition Vpi, for example, a power voltage Vcc, is applied to the second through m-th bit lines BL2, . . . , BLm, i.e., the unselected bit lines. A power voltage Vcc is applied to the string control line SCL, and a program voltage $V_{PGM}$ of about 20 volts is applied to the second word control line W2. A voltage of 0 volts is applied to the first and third word control lines W1 and W3, and a pass voltage $V_{PASS}$ of about 11 volts is applied to the fourth through n-th word control lines W4, ..., Wn. A voltage, which is higher than the program voltage $V_{PGM}$ applied to the second word control line W2, i.e., a voltage of $V_{PGM}+\alpha$, is applied to the driver control line DCL to completely turn on the second word driver transistor WDT2. Here, the voltage $\alpha$ must be higher than the threshold voltage of the second word driver transistor WDT2.

As described above, to program the conventional NAND-type flash memory device, a high voltage higher than a program voltage should be applied to the driver control line DCL of the block driver 310 for controlling the selected cell block. As a result, the string driver transistor SDT, n word driver transistors WDT1, WDT2, ..., and WDTn and the ground driver transistor GDT are all turned on. At this time, the selected second cell transistor C12 is programmed by F-N tunneling current, and the unselected cell transistors are inhibited from being programmed by a self-boosting phenomenon [Tae-Sung Jung, et. al. "A 3.3 V 128 Mb Multi-Level NAND Flash Memory for Mass Storage Application", ISSCC Digest of Technology Papers, pp. 32–33, Feb., 1996].

FIG. 3 is a sectional view showing the condition of a bias, which is applied to the first and third word driver transistors WDT1 and WDT3 and the ground driver transistor GDT when the second cell transistor C12 of the first string S1 is selectively programmed. Referring to FIG. 3, a voltage of $V_{PGM}+\alpha$ is applied to the gate electrodes 7 of the first and third word driver transistors WDT1 and WDT3 and the ground driver transistors GDT, and a voltage of 0 volts is applied to source/drain regions 3 and bulk region 1. As a result, a channel region 9 of 0 volts is formed on the surface of the bulk region 1 between the source/drain regions 3. Consequently, a high electric field caused by the voltage of $V_{PGM}+\alpha$ is applied to a gate insulating film 5, thereby deteriorating the reliability of the gate insulating film 5.

FIG. 4 is a graph showing the results of measuring the reliability of the driver transistors SDT, WDT1, ..., WDTn and GDT. The horizontal axis indicates the number N of applications of an electrical stress, that is, a pulse signal having a voltage of 25 volts and a width of 1.5 msec, to the gate electrode of each of the driver transistors SDT, WDT1, ..., WDTn and GDT. The vertical axis indicates the threshold voltage of each of the driver transistors SDT, WDT1, ..., WDTn and GDT. At this time, a voltage of 0 volts was applied to all the bulk regions and the source/drain regions in the driver transistors SDT, WDT1, ..., WDTn and GDT. The electrical stress was applied in an atmosphere having a temperature of 85° C. In FIG. 4, data referred to as a is a result of measuring the reliability of driver transistors having a gate insulating film which is formed of a thermal oxide film having a thickness of 330 Å, and data referred to as b is a result of measuring the reliability of driver transistors having a gate insulating film which is formed of a thermal oxide film having a thickness of 300 Å.

It can be seen from FIG. 4 that the threshold voltage of a driver transistor gradually decreases as the number of applications of a high voltage of about 25 volts to the gate electrode of the driver transistor increases. In addition, it can be seen that the reliability of a driver transistor decreases as the thickness of the gate insulating film of the driver transistor decreases. Therefore, a program voltage should be lowered or the thickness of the gate insulating film of a driver transistor should be increased, to prevent the deterioration of the reliability of the driver transistor. However, due to a coupling ratio related to an inter-gate dielectric film, which is interposed between a floating gate and a control gate electrode in a cell transistor, and to a tunnel oxide film, which is interposed between the floating gate and a semiconductor substrate, it is difficult to decrease a program voltage. Moreover, when thickly forming the gate insulating film of a driver transistor, an additional process is required, thereby complicating fabrication processes.

As described above, when the threshold voltage of a driver transistor is lowered, the sub-threshold characteristic of the driver transistor deteriorates. Accordingly, even if a voltage of 0 volts is applied to the gate electrode, leakage current flows between the source region and the drain region. In the case where the sub-threshold characteristics of the driver transistors, particularly, the word driver transistors, deteriorate, a problem of erasing unselected cell blocks may occur when a selected cell block is erased in a NAND-type flash memory device.

With reference back to FIG. 2, the erasing operation of a conventional NAND-type flash memory device will be described. It is assumed that a selected cell block to be erased is a certain cell block (not shown) which has the same structure as the cell block including the first through m-th strings S1 through Sm and shares the m bit lines BL1 through BLm. Accordingly, the cell block including the first through m-th strings S1 through Sm is not selected. The selected cell block is controlled by an additional block driver (not shown) which has the same structure as the block driver 310 of FIG. 2, as described above.

To erase only the selected cell block, the m bit lines BL1 through BLm are floated, and an erase voltage $V_{ERASE}$ of about 20 volts is applied to a semiconductor substrate on which the cell array area 100a is formed, that is, the bulk regions of the cell transistors of the selected and unselected cell blocks. All common source lines CS are floated. The common source lines CS may be electrically connected to the bulk regions. In this case, the same erase voltage $V_{ERASE}$ applied to the bulk regions is applied to the common source line CS. In addition, the string control line SCL and the ground control line GCL are floated, and a voltage of 0 volts is applied to the first through n-th word control lines W1, W2, W3, ..., and Wn. A power voltage Vcc is applied to the driver control line of the block driver which controls the selected cell block to turn on all the driver transistors of the selected block driver. On the other hand, a voltage of 0 volts is applied to the driver control line DCL of the block driver 310 which controls the unselected cell block to turn off all the driver transistors SDT, WDT1, WDT2, WDT3, ..., WDTn and GDT of the unselected block driver 310.

As described above, when an appropriate voltage is applied to each control line, a voltage of 0 volts is applied to the control gate electrodes of all cell transistors within the selected cell block. Accordingly, holes from the bulk regions are injected into the floating gates of all the cell transistors within the selected cell block so that information of the cell transistors can be erased. At this time, the first through n-th word driver transistors WDT1, WDT2, WDT3, ..., and WDTn of the block driver 310, which controls the unselected cell block, should be turned off. As described in FIGS. 3 and 4, however, one or more word driver transistors of the block driver 310, for example, the first and third word driver transistors WDT1 and WDT3, can exhibit deteriorating characteristics due to electrical stress while the program operation is being performed a predetermined number of times or more. As a result, even if a voltage of 0 volts is applied to the driver control line DCL of the block driver 310, the first and third word driver transistors WDT1 and WDT3 are slightly turned on. Consequently, a voltage of or in vicinity of 0 volts is applied to the first and third word lines WL1 and WL3 of the unselected cell block, thereby erasing information stored in the cell transistors which are connected to the first and third word lines WL1 and WL3. In this case, the sub-threshold leakage current of the ground driver transistor GDT does not directly cause errors in the erase operation.

SUMMARY OF THE INVENTION

To solve the above problems, it is a first object of the present invention to provide a NAND-type flash memory device and a method of operating the same, for minimizing a gate bias which is applied to the driver transistors of a block driver connected to a cell block including selected cell transistors when selectively programming the desired cell transistors.

It is a second object of the present invention to provide a NAND-type flash memory device and a method of operating the same, for improving the reliability of the driver transistors of a block driver.

In accordance with the invention, there is provided a NAND-type flash memory device including a cell array area, which has a plurality of cell blocks, and a row decoder which has a plurality of block drivers, a string control line, n word control lines and a ground control line, the plurality of block drivers being connected to the plurality of cell blocks, respectively. The string control line, n word control lines and a ground control line are connected to the plurality of block drivers. Each of the block drivers includes a string driver transistor, n word driver transistors and a ground driver transistor. The string driver transistor is interposed between the string select line of a cell block and the string control line. The n word driver transistors are interposed between the n word lines of the cell block and the n word control lines, respectively. The ground driver transistor is interposed between the ground select line of the cell block and the ground control line. Each block driver also includes a first driver control line, which is connected to the gate electrodes of the odd numbered word driver transistors among the n word driver transistors, and a second driver control line, which is connected to the gate electrodes of the even numbered word driver transistors among the n word driver transistors.

Accordingly, in each block driver, the odd numbered word driver transistors are controlled independently from the even numbered word driver transistors. In addition, each block driver may further include a third driver control line which is connected to the gate electrode of the string driver transistor and the gate electrode of the ground driver transistor. Alternatively, the gate electrode of the string driver transistor in each block driver may be connected to the first or second driver control line, and the gate electrode of the ground driver transistor in each block driver may also be connected to the first or second driver control line.

The plurality of cell blocks share m bit lines. Each of the cell blocks includes m strings connected to the m bit lines, respectively. Accordingly, a plurality of strings, the number of which is the same as the number of the cell blocks, are connected to each bit line. Each string includes a string select transistor, n cell transistors and a ground select transistor, which are sequentially connected to each bit line in series. Accordingly, the strings correspond to NAND strings. Each cell transistor has a stacked gate structure. That is, each cell transistor has a tunnel insulating film, a floating gate, an inter-gate dielectric film and a control gate electrode which are sequentially stacked on the channel region between the source region and the drain region.

Each cell block also includes a string select line, n word lines and a ground select line, which cross the m bit lines. The string select line in each cell block is connected to the gate electrode of the string select transistors of the m strings, and the ground select line is connected to the gate electrodes of the ground select transistors of the m strings. Similarly, the n word lines are connected to the control gate electrodes of the n cell transistors of each string.

Each block driver functions as a switch for selectively applying a desired voltage to the string select line, the n word lines and the ground select line of a cell block which is connected thereto. The source region and the drain region of the string driver transistor of each block driver are connected to the string control line and the string select line, respectively. The source region and the drain region of the ground driver transistor of each block driver are connected to the ground control line and the ground select line, respectively. Similarly, the source regions of the n word driver transistors of each block driver are connected to the n word control lines, and the drain regions of the n word driver transistors are connected to the n word lines.

As described above, according to the present invention, different voltages can be applied to the gate electrodes of the odd numbered word driver transistors and to the gate electrodes of the even numbered word driver transistors, among the n word driver transistors connected to the n word lines of each cell block one to one.

A method of operating, that is, programming, a NAND-type flash memory device having a structure as described above is performed after erasing a desired cell block or all cell blocks. That is, an erasing operation is performed such that all cell transistors in at least one cell block including at least one cell transistor to be programmed have a threshold voltage of lower than 0 volts, for example, about −3 volts, before performing a programming operation.

In accordance with the programming method of the invention, one of the m bit lines is selected, and one of the plurality of strings which are connected to the selected bit line is selected. A first voltage higher than a program voltage is applied to one group of the group of gate electrodes of the odd numbered word driver transistors in a block driver connected to the selected string and the group of the gate electrodes of the even numbered word driver transistors in the block driver connected to the selected string. A second voltage, which is higher than a pass voltage and lower than the program voltage, is applied to the other group of the gate electrodes, to selectively program one of the n cell transistors of the selected string.

In one embodiment, the pass voltage is higher than a power voltage. In one embodiment, the first voltage is the program voltage plus α, and the second voltage is the pass voltage plus β. The voltage oα x is equal to or higher than a threshold voltage, which the word driver transistors have when a bulk bias corresponding to the program voltage is applied between the bulk region and the source region in each word driver transistor. The voltage β is equal to or higher than a threshold voltage, which the word driver transistors have when a bulk bias corresponding to the pass voltage is applied between the bulk region and the source region in each word driver transistor.

In one embodiment, the step of selecting one bit line is implemented by selecting and grounding one bit line among the m bit lines, and applying a program inhibition voltage, for example, a power voltage, to unselected bit lines among the m bit lines.

The step of selecting one string can be implemented by applying the power voltage and a voltage of 0 volts to the string control line and the ground control line, respectively, and turning on a string driver transistor and a ground driver transistor connected to one of the plurality of strings which are connected to the selected bit line in parallel.

The step of tunning on the string driver transistor and the ground driver transistor can be implemented by applying a third voltage higher than the power voltage to the gate electrode of the string driver transistor and to the gate electrode of the ground driver transistor. Preferably, the third voltage is lower than the program voltage. Most preferably, the third voltage is lower than the pass voltage and is the power voltage plus γ. The voltage γ is equal to or higher than a threshold voltage, which the string driver transistor has when a bulk bias corresponding to the power voltage is applied between the bulk region and the source region in the string driver transistor. As a result, both the string driver transistor and the ground driver transistor are turned on. Consequently, the string select transistor of the selected string is turned on, and thus the channel region of the string select transistor comes to have the ground voltage applied to the selected bit line.

In another embodiment, the step of tunning on the string driver transistor and the ground driver transistor can be implemented by applying the first or second voltage to the gate electrode of the string driver transistor, and applying the first or second voltage to the gate electrode of the ground driver transistor. Since the first and second voltages are higher than the third voltage, the string driver transistor is turned on.

In the step of programming one cell transistor, one word control line among the n word control lines, for example, a word control line which is connected to one of the word driver transistors having the gate electrodes to which the first voltage is applied, is selected, and the program voltage is applied to the selected word control line. A voltage of 0 volts is applied to a pair of word control lines which are disposed at both sides of the selected word control line. The pass voltage is applied to remaining word control lines other than the selected word control line and the grounded pair of word control lines among the n word control lines. Accordingly, among the n cell transistors of the selected string, a cell transistor connected to the word control line to which the program voltage is applied is selectively programmed. The channel regions of the word driver transistors having the gate electrodes to which the first voltage is applied have the program voltage or the pass voltage. Accordingly, the maximum value of a gate bias, which is applied between the channel area and the gate electrode in each word driver transistor, is $(V_{PGM}+\alpha)-V_{PASS}$. The channel regions of the word driver transistors having the gate electrodes to which the first voltage is applied have a voltage of 0 volts or the pass voltage. Accordingly, the maximum value of a gate bias, which is applied between the channel area and the gate electrode in each word driver transistor, is $V_{PASS}+\beta$. Consequently, compared to conventional technology, a NAND-type flash memory device of the present invention can lower a gate bias which is applied to the word driver transistors during a programming operation. Therefore, the reliability of the word driver transistors can be improved, thereby decreasing errors occurring during an erasing operation.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENTS

Hereinafter, embodiments of the present invention will be described in detail with reference to the attached drawings.

Figure 1:
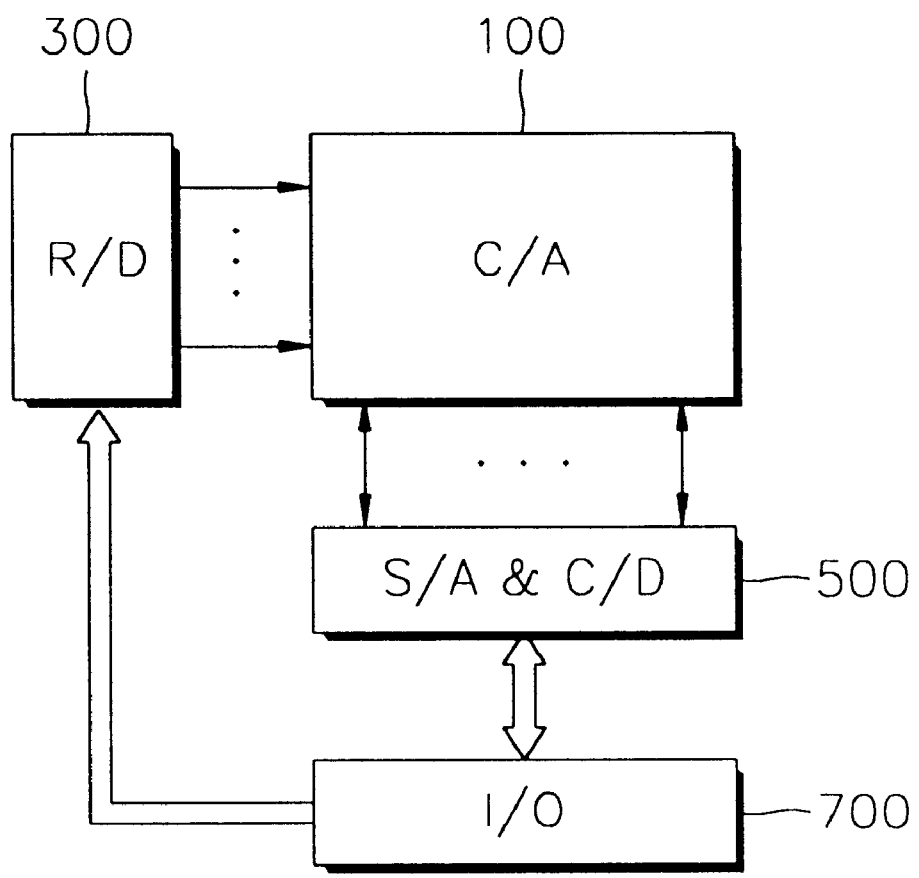
FIG. 1 is a block diagram of a typical NAND-type flash memory device.
Figure 2:
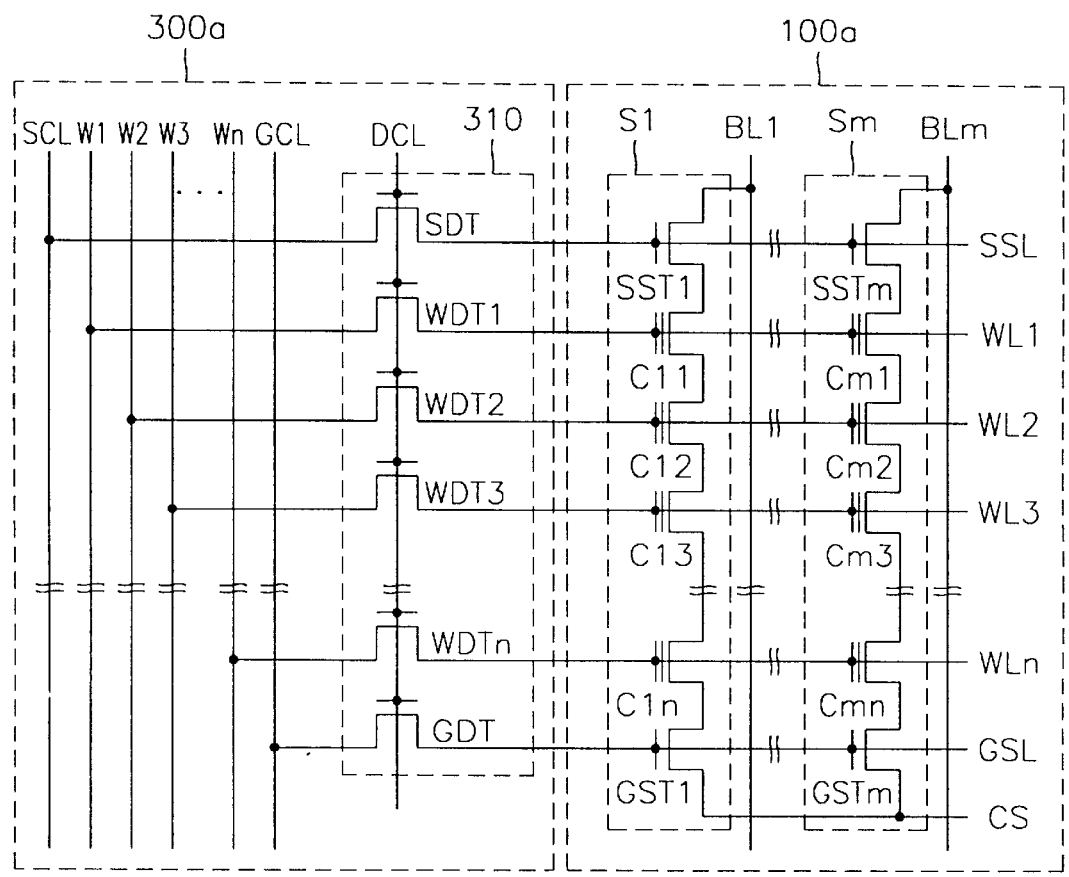
FIG. 2 is a circuit diagram partially showing a cell array area and a row decoder driving the cell array area in a conventional NAND-type flash memory device.
Figure 3:
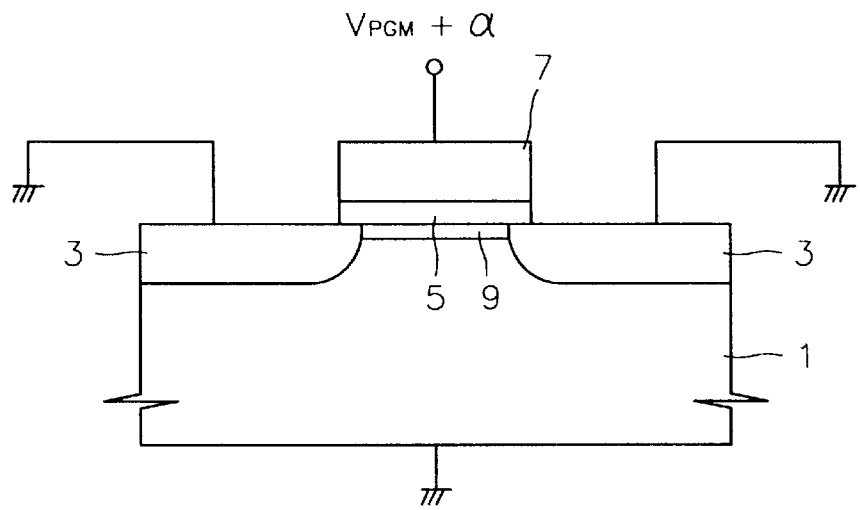
FIG. 3 is a schematic sectional view showing the worst condition of a bias which is applied to the driver transistors of the row decoder when a predetermined cell in the cell array area shown in FIG. 2 is programmed.
Figure 4:
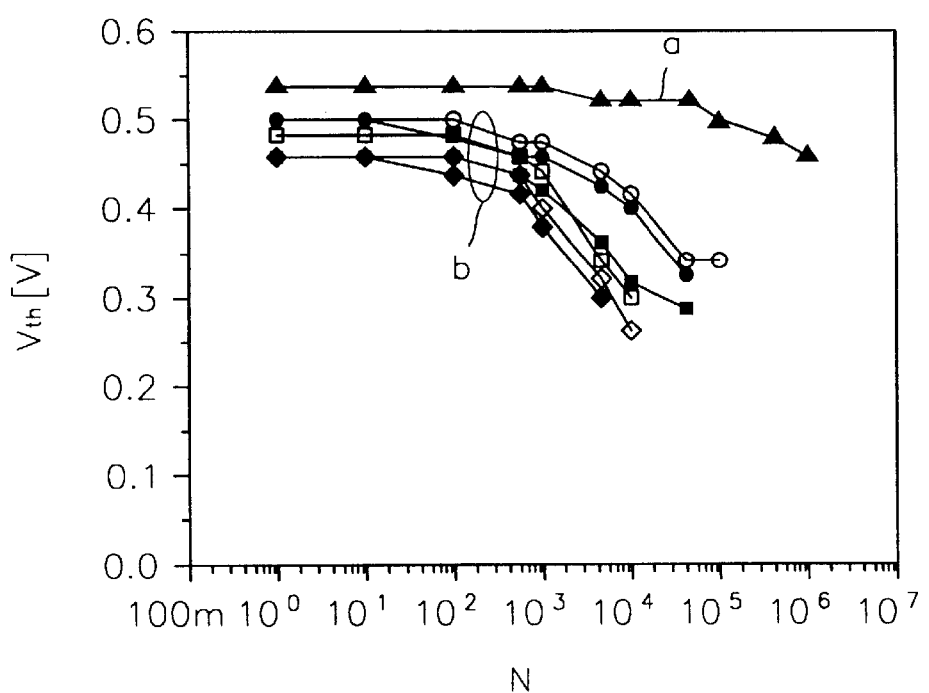
FIG. 4 is a graph showing results of measuring the reliability of driver transistors, to which a bias is applied as shown in FIG. 3.
Figure 5:
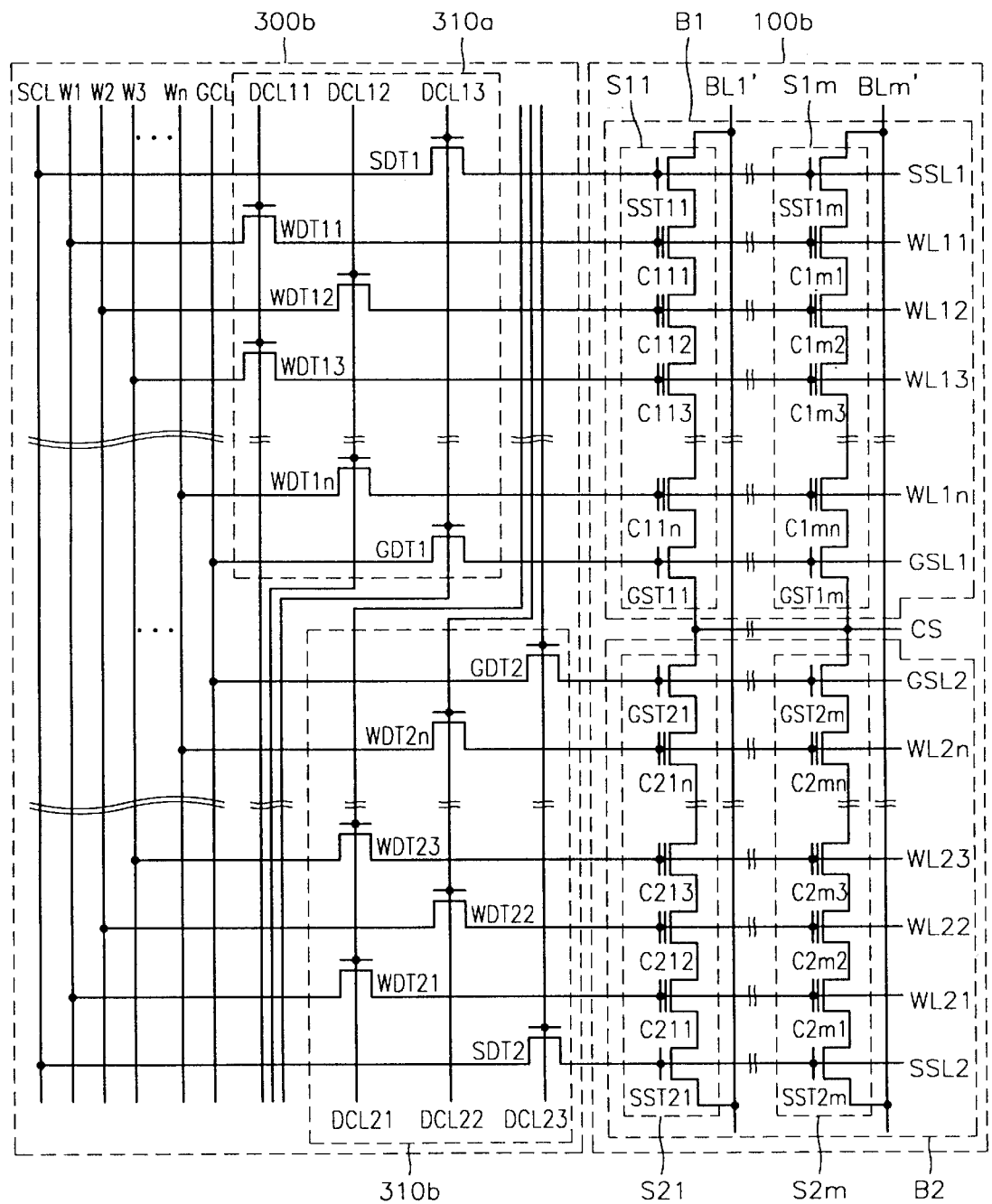
FIG. 5 is a circuit diagram partially showing a row decoder and a cell array area driven by the row decoder in a NAND-type flash memory device according to a first embodiment of the present invention.

With reference to FIG. 5, a first embodiment of a NAND-type flash memory device will be described. In the following description, it is assumed that the cell transistors, string select transistors and ground select transistors of a cell array area and the driver transistors of a row decoder are all NMOS transistors.

Referring to FIG. 5, a cell array area 100b shares m bit lines BL1' through BLm' which are parallel. A row decoder 300b driving the cell array area 100b includes a single string control line SCL, n word control lines W1, W2, W3, . . . , and Wn and a single ground control line GCL. The row decoder 300b also includes a plurality of block drivers, i.e., two block drivers 310a and 310b, which are connected to the string control line SCL and the n word control lines W1, W2, . . . , and Wn.

The first block driver 310a of the two block drivers 310a and 310b includes a string driver transistor SDT1, which has a source region connected to the string control line SCL, and a ground driver transistor GDT1, which has a source region connected to the ground control line GCL. The first block driver 310a also includes n word driver transistors WDT11, WDT12, WDT13, . . . , and WDT1n, which have source regions, respectively, connected to n word control lines W1, W2,W3, . . . , Wn, respectively. The gate electrodes of odd numbered word driver transistors WDT11, WDT13, . . .

among the n word driver transistors WDT111, WDT12, WDT13, . . . , and WDT1n are connected to a first driver control line DCL11. The gate electrodes of even numbered word driver transistors WDT12, . . . among the n word driver transistors WDT11, WDT12, WDT13, . . . , and WDT1n are connected to a second driver control line DCL12. The gate electrode of the string driver transistor SDT1 and the gate electrode of the ground driver transistor GDT1 are connected to a third driver control line DCL13. Accordingly, the odd numbered word driver transistors WDT11, WDT13, . . . are controlled by the first driver control line DCL11, and the even numbered word driver transistors WDT12, . . . are controlled by the second driver control line DCL12. The string driver transistor SDT1 and the ground driver transistor GDT1 are controlled by the third driver control line DCL13.

The second block driver 310b has the same structure as the first block driver 310a. The second block driver 310b includes a string driver transistor SDT2, which has a source region connected to the string control line SCL, and a ground driver transistor GDT2, which has a source region connected to the ground control line GCL. The second block driver 310b also includes n word driver transistors WDT21, WDT22, WDT23, . . . , and WDT2n, which have source regions connected to n word control lines W1, W2, W3 . . . , Wn, respectively. The gate electrodes of odd numbered word driver transistors WDT21, WDT23, . . . among the n word driver transistors WDT21, WDT22, WDT23, . . . , and WDT2n are connected to a first driver control line DCL21. The gate electrodes of even numbered word driver transistors WDT22, . . . among the n word driver transistors WDT21, WDT22, WDT23, . . . , and WDT2n are connected to a second driver control line DCL22. The gate electrode of the string driver transistor SDT2 and the gate electrode of the ground driver transistor GDT2 are connected to a third driver control line DCL23. Accordingly, the odd numbered word driver transistors WDT21, WDT23, . . . are controlled by the first driver control line DCL21, and the even numbered word driver transistors WDT22, . . . are controlled by the second driver control line DCL22. The string driver transistor SDT2 and the ground driver transistor GDT2 are controlled by the third driver control line DCL23.

The cell array area 100b sharing the m bit lines BL1' through BLm' includes a plurality of cell blocks, i.e., first and second cell blocks B1 and B2. The first cell block B1 includes m strings S11 through S1m which are connected to the m bit lines BL1' through BLm', respectively. Like a typical NAND string, each of the strings S11 through S1m includes a single select transistor, n cell transistors and a single ground select transistor, which are sequentially connected to a single bit line in series. For example, the first string S11 among the m strings S11 through S1m includes a string select transistor SST11, n cell transistors C111, C112, C113, . . . , and C11n and a ground select transistor GST11, which are sequentially connected to the first bit line BL1'. Similarly, the m-th string S1m includes a string select transistor SST1m, n cell transistors C1m1, C1m2, C1m3, . . . , and C1mn and a ground select transistor GST1m, which are sequentially connected to the m-th bit line BLm'. The source regions of the m ground select transistors GST11 through GST1m are connected to a single common source line CS which is shared by the first and second cell blocks B1 and B2. Each cell transistor has a stacked gate structure. That is, each cell transistor has a structure in which a tunnel insulating film, a floating gate, an inter-gate dielectric film and a control gate electrode are sequentially stacked on a semiconductor substrate between a source region and a drain region.

The first cell block B1 also includes a string select line SSL1, n word lines WL11, WL12, WL13, . . . , and WL1n and a ground select line GSL1, which cross the m bit lines BL1' through BLm'. The string select line SSL1 is connected to the gate electrodes of the m string select transistors SST11 through SST1m. The ground select line GSL1 is connected to the gate electrodes of the m ground select transistors GST11 through GST1m. The first word line WL11 is connected to the gate electrodes of the first cell transistors C11 through C1m1 of the m strings S11 through S1m. The second word line WL12 is connected to the gate electrodes of the second cell transistors C112 through C1m2 of the m strings S11 through S1m. Similarly, the third word line WL13 is connected to the gate electrodes of the third cell transistors C113 through C1m3 of the m strings S11 through S1m, and the n-th word line WL1n is connected to the gate electrodes of the n-th cell transistors C11n through C1mn of the m strings S11 through S1m.

The string select line SSL1 and the n word lines WL11, WL12, WL 13, . . . , and WL1n and the ground select line GSL1 in the first cell block B1 are connected to the first block driver 310a. More specifically, the string select line SSL1 is connected to the drain region of the string driver transistor SDT1, and the ground select line GSL1 is connected to the drain region of the ground driver transistor GDT1. The first word line WL11 is connected to the drain region of the first word driver transistor WDT11, and the second word line WL12 is connected to the drain region of the second word driver transistor WDT12. Similarly, the third word line WL13 is connected to the drain region of the third word driver transistor WDT13, and the n-th word line WL1n is connected to the drain region of the n-th word driver transistor WDT1n.

The second cell block B2 has the same structure as the first cell block B1. In other words, the second cell block B2 includes m strings S21 through S2m which are connected to the m bit lines BL1' through BLm', respectively. Like a typical NAND string, each of the strings S21 through S2m includes a single select transistor, n cell transistors and a single ground select transistor, which are sequentially connected to a single bit line in series. For example, the first string S21 among the m strings S21 through S2m includes a string select transistor SST21, n cell transistors C211, C212, C213, . . . , and C21n and a ground select transistor GST21, which are sequentially connected to the first bit line BL1'. Similarly, the m-th string S2m includes a string select transistor SST2m, n cell transistors C2m1, C2m2, C2m3, . . . , and C2mn and a ground select transistor GST2m, which are sequentially connected to the m-th bit line BLm'. The source regions of the m ground select transistors GST21 through GST2m are connected to the common source line CS.

Like the first cell block B1, the second cell block B2 also includes a string select line SSL2, n word lines WL21, WL22, WL23, . . . , and WL2n and a ground select line GSL2, which cross the m bit lines BL1' through BLm'. The string select line SSL2 is connected to the gate electrodes of the m string select transistors SST21 through SST2m. The ground select line GSL2 is connected to the gate electrodes of the m ground select transistors GST21 through GST2m. The first word line WL21 is connected to the gate electrodes of the first cell transistors C211 through C2m1 of the m strings S21 through S2m. The second word line WL22 is connected to the gate electrodes of the second cell transistors C212 through C2m2 of the m strings S21 through S2m. Similarly, the third word line WL23 is connected to the gate electrodes of the third cell transistors C213 through C2m3 of the m strings S21 through S2m, and the n-th word line WL2n is connected to the gate electrodes of the n-th cell transistors C21n through C2mn of the m strings S21 through S2m.

The string select line SSL2 and the n word lines WL21, WL22, WL23, . . . , and WL2n and the ground select line GSL2 in the second cell block B2 are connected to the second block driver 310b. More specifically, the string select line SSL2 is connected to the drain region of the string driver transistor SDT2, and the ground select line GSL2 is connected to the drain region of the ground driver transistor GDT2. The first word line WL21 is connected to the drain region of the first word driver transistor WDT21, and the second word line WL22 is connected to the drain region of the second word driver transistor WDT22. Similarly, the third word line WL23 is connected to the drain region of the third word driver transistor WDT23, and the n-th word line WL2n is connected to the drain region of the n-th word driver transistor WDT2n.

The following description concerns the operation of the NAND-type flash memory device shown in FIG. 5.

First, a method of selectively erasing one, for example, the first cell block, of the two cell blocks B1 and B2 will be described. The string control line SCL and the ground control line GCL of the row decoder 300b are floated, and a voltage of 0 V is applied to the n word control lines W1, W2, W3, . . . , and Wn. The m bit lines BL1' through BLm' and the common source line CS are also floated, and a power voltage is applied to the first through third driver control lines DCL11, DCL12 and DCL13 of the first block driver 310a. In addition, an erase voltage $V_{ERASE}$, for example, of about 20 volts, is applied to a semiconductor substrate having the cell array area 100b, that is, the bulk regions of all cell transistors. A voltage of 0 V is applied to the driver control lines of block drivers connected to unselected cell blocks, for example, the first through third driver control lines DCL21, DCL22 and DCL23 of the second block driver 310b, other than the selected first cell block B1.

As a result, the n word driver transistors WDT21, WDT22, WDT23, . . . , and WDT2n of the second block driver 310b are turned off, thereby floating the n word lines WL21, WL22, WL23, . . . , and WL2n of the second cell block B2. Consequently, a voltage of 0 volts is selectively applied to only the n word lines WL11, WL12, WL13, . . . , and WL1n of the first cell block, and thus holes are injected into the floating gates of all the cell transistors of the first cell block B1. Accordingly, each of the cell transistors of the first cell block B1 has a negative threshold voltage, for example, of about −3 volts.

In addition, the present invention can erase all the cell transistors in the cell array area 100b. For example, when a power voltage is applied to all the driver control lines DCL11, DCL12, DCL13, DCL21, DCL22 and DCL23 of the first and second block drivers 310a and 310b, all the cell transistors of the first and second cell blocks B1 and B2 are erased.

Next, a method of selectively programming one cell transistor of the first cell block B1, for example, the second cell transistor C112 of the first string S11, after erasing all the cell transistors of the first cell block B1 will be described. A voltage of 0 volts is applied to a bit line, which is connected to the first string S11 including the selected second cell transistor C112, i.e., the first bit line BL1', and a program inhibition voltage $V_{PI}$, for example, a power voltage, is applied to the second through the m-th bit lines BL2' through BLm'. A power voltage is applied to the string control line SCL, and a voltage of 0 volts is applied to the ground control line GCL, the common source line CS and the semiconductor substrate with the cell array area 100b, that is, a P well area.

A program voltage $V_{PGM}$ of about 18–23 volts is applied to the second word control line W2 which is connected to the control gate electrode of the selected cell transistor C112, and a voltage of 0 volts is applied to the first and third word control lines W1 and W3, which are disposed at both sides of the second word control line W2. In addition, a pass voltage of about 10–12 volts is applied to the fourth through n-th word control lines W4 through Wn.

Moreover, a first voltage, which is higher than the program voltage, is applied to the second driver control line DCL12, which is connected to the gate electrode of the second word driver transistor WDT12 controlling the selected second cell transistor C112. A second voltage, which is higher than the pass voltage and lower than the program voltage, is applied to the first driver control line DCL11, and a third voltage, which is higher than the power voltage and lower than the pass voltage, is applied to the third driver control line DCL13. A voltage of 0 volts is applied to all the driver control lines of the unselected block drivers, i.e., the first through third driver control lines DCL21, DCL22 and DCL23 of the second block driver 310b, thereby turning off the string driver transistor SDT2, the n word driver transistors WDT21, WDT22, WDT23, . . . , and WDT2n and the ground driver transistor GDT2.

The first voltage is the program voltage plus α, the second voltage is the pass voltage plus β, and the third voltage is the power voltage plus γ. The voltage α is equal to or higher than a threshold voltage which the n driver transistors WDT11, WDT12, WDT13, . . . , and WDT1n have when a back gate bias corresponding to the program voltage is applied to the bulk regions of the n driver transistors WDT11, WDT12, WDT13, . . . , and WDT1n. The voltage β is equal to or higher than a threshold voltage which the n driver transistors WDT11, WDT12, WDT13, . . . , and WDT1n have when a back gate bias corresponding to the pass voltage is applied to the bulk regions of the n driver transistors WDT11, WDT12, WDT13, . . . , and WDT1n. The voltage γ is equal to or higher than a threshold voltage which the string driver transistor SDT1 and the ground driver transistor GDT1 have when a back gate bias corresponding to the power voltage is applied to the bulk regions of the string driver transistor SDT1 and the ground driver transistor GDT1.

As a result, only the second cell transistor C112 of the first cell block B1 is selectively programmed to thereby have the threshold voltage.

The operation of the NAND-type flash memory device of FIG. 5 can be summarized by the following Table 1.

TABLE 1

|  | Erase | Program |
|---|---|---|
| Selected bit line | FLOAT | 0 |
| Unselected bit line | FLOAT | $V_{PI}$ |
| String control line SCL | FLOAT | Vcc |
| Selected word control line $W_i$ | 0 | $V_{PGM}$ |
| $W_{i-1}$ and $W_{i+1}$ | 0 | 0 |
| $W_1$-$W_{i-2}$ and $W_{i+2}$-$W_n$ | 0 | $V_{PASS}$ |
| Ground control line GCL | FLOAT | 0 |
| Common source line CS | FLOAT | 0 |
| First driver control line of selected cell block | Vcc | $V_{PGM}$ + α (or $V_{PASS}$ + β) |
| Second driver control line of selected cell block | Vcc | $Y_{PASS}$ + β (or $V_{PGM}$ + α) |

TABLE 1-continued

| | Erase | Program |
|---|---|---|
| Third driver control line of selected cell block | Vcc | Vcc + γ |
| Driver control lines of unselected cell blocks | 00 | 0 |
| Bulk regions | $V_{ERASE}$ | 0 |

Figure 6A:
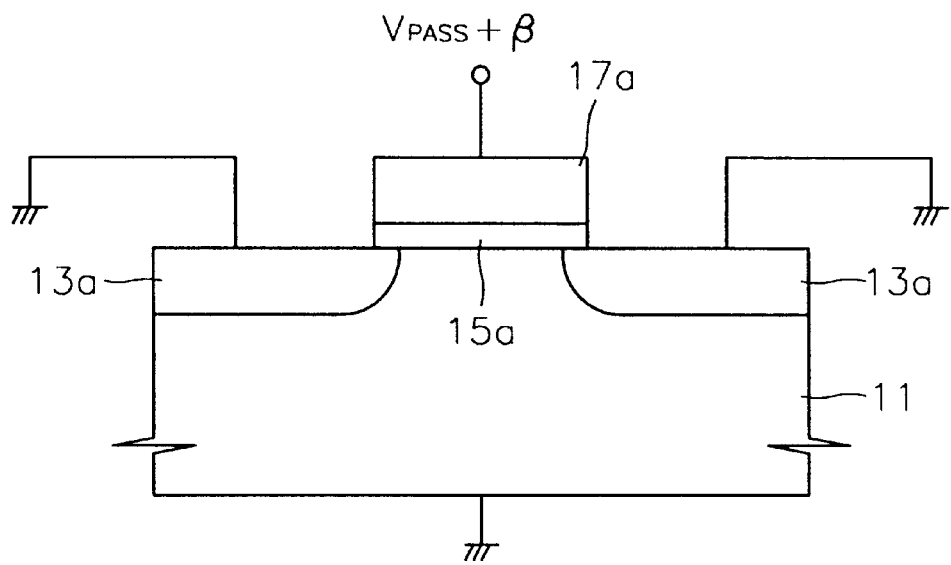
FIGS. 6A and 6B are schematic sectional views showing the worst conditions of a bias which is applied to the driver transistors of FIG. 5.
Figure 6B:
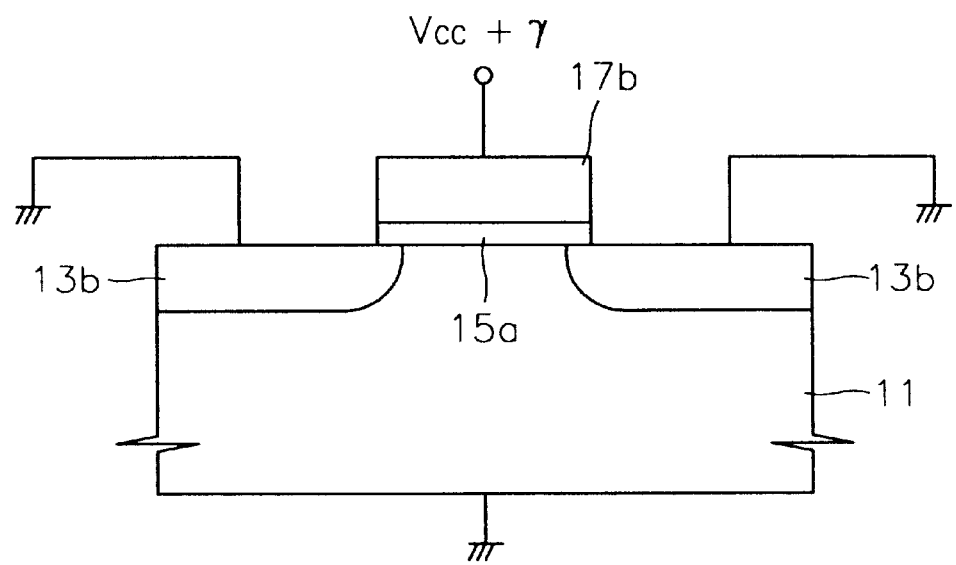

FIGS. 6A and 6B are sectional views showing the worst case conditions in which a bias is applied to the word driver transistors of the first block driver 310a while the cell transistor C112 of the NAND-type flash memory device of FIG. 5 is being selectively programmed. In other words, FIG. 6A is a sectional view showing a condition in which a bias is applied to the first and third word driver transistors WDT11 and WDT13. FIG. 6B is a sectional view showing a condition in which a bias is applied to the ground driver transistor GDT1.

Referring to FIG. 6A, the second voltage, that is, the pass voltage plus β, is applied through the first driver control line DCL11 to the gate electrodes 17a of the first and third word driver transistors WDT11 and WDT13 while the cell transistor C112 is selectively being programmed. In addition, a voltage of 0 volts is applied through the first and third word control lines W1 and W3 to the source regions 13a of the first and third word driver transistors WDT11 and WDT13, and is also applied to a bulk region 11. Accordingly, the first and third word driver transistors WDT11 and WDT13 are turned on, and thus the drain regions 13a of the first and third driver transistors WDT11 and WDT13 come to have a voltage of 0 volts. Consequently, an electric field, which is applied to a gate insulating film 15a below the gate electrodes 17a, is considerably lower compared to conventional technology, thereby improving the reliability of the gate insulating film 15a. In other words, according to the present invention, a maximum gate bias applied to the word driver transistors is considerably reduced no matter which cell transistor is selected and programmed.

Referring to FIG. 6B, the third voltage, that is, the power voltage plus γ, is applied through the third driver control line DCL13 to the gate electrode 17b of the ground driver transistors GDT1 while the cell transistor C112 is selectively being programmed. In addition, a voltage of 0 volts is applied through the ground control line GCL to the source region 13a of the ground driver transistors GDT1, and is also applied to the bulk region 11. Accordingly, the ground driver transistor GDT1 is turned on, and thus the drain region 13b of the ground driver transistors GDT1 comes to have a voltage of 0 volts. Consequently, an electric field, which is applied to a gate insulating film 15b below the gate electrode 17b, is considerably lower compared to conventional technology, thereby improving the reliability of the gate insulating film 15b. In other words, according to the present invention, a maximum gate bias applied to the ground driver transistor GDT1 is considerably reduced no matter which cell transistor is selected and programmed.

Figure 7:
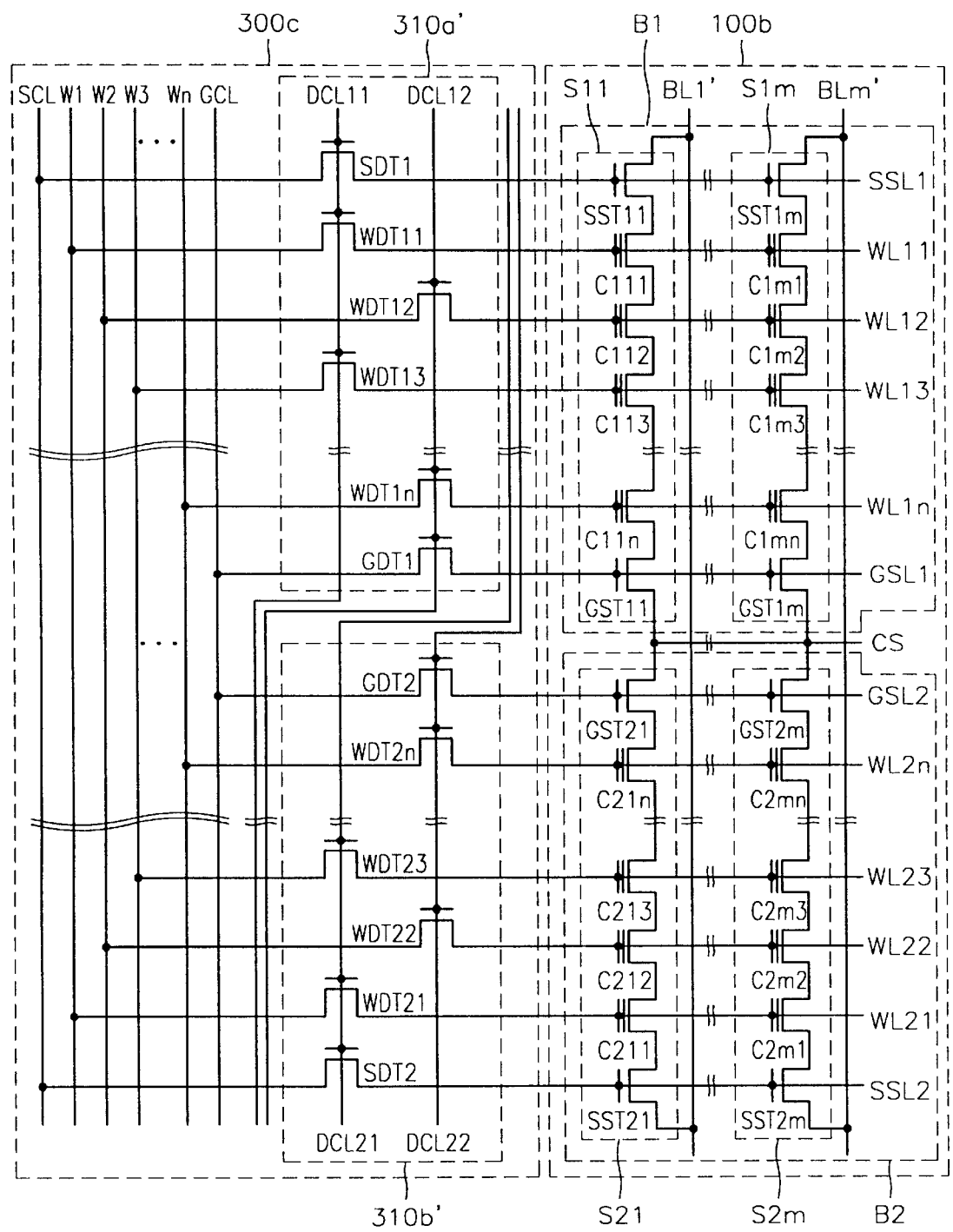
FIG. 7 is a circuit diagram partially showing a row decoder and a cell array area driven by the row decoder in a NAND-type flash memory device according to a second embodiment of the present invention.

FIG. 7 is a circuit diagram illustrating a second embodiment of a NAND-type flash memory device according to the present invention. There is a difference between the second embodiment of FIG. 7 and the first embodiment of FIG. 5 in that the string driver transistor and the ground driver transistor of each block driver are controlled by a first driver control line and a second driver control line, respectively, in the second embodiment of FIG. 7. Moreover, in the modified example of FIG. 7, the string driver transistor and the ground driver transistor of each block driver may be controlled by the second driver control line and the first driver control line, respectively. The cell array area of FIG. 7 has the same structure as the cell array area of FIG. 5, and thus a description of the cell array area of FIG. 7 will be omitted.

Referring to FIG. 7, a row decoder 300c includes a string control line SCL, n word control lines W1, W2, W3, ..., and Wn and a ground control line GCL. The row decoder 300c also includes a plurality of block drivers, i.e., first and second block drivers 310a' and 310b'. Like the first block driver 310a of FIG. 5, the first block driver 310a' includes a string driver transistor SDT1, n word driver transistors WDT11, WDT12, WDT13, ..., and WDT1n and a ground driver transistor GDT1. The gate electrodes of odd numbered word driver transistors WDT11, WDT13, ... and the gate electrode of the string driver transistor SDT1 are connected to a first driver control line DCL11. The gate electrodes of even numbered word driver transistors WDT12, ... and the gate electrode of the ground driver transistor GDT1 are connected to a second driver control line DCL12. Alternatively, the gate electrode of the string driver transistor SDT1 and the gate electrode of the ground driver transistor GDT1 may be connected to the second driver control line DCL12 and the first driver control line DCL11.

The second block driver 310b' has the same structure as the first block driver 310a'. That is, the gate electrodes of odd numbered word driver transistors WDT21, WDT23, ... and the gate electrode of the string driver transistor SDT2 are connected to a first driver control line DCL21. The gate electrodes of even numbered word driver transistors WDT22, ... and the gate electrode of the ground driver transistor GDT2 are connected to a second driver control line DCL22.

The following description concerns the operation of the NAND-type flash memory device of FIG. 7. To erase all the cell transistors of the first cell block B1, a power voltage is applied to the first and second driver control lines DCL11 and DCL12 of the first block driver 310a', and a voltage of 0 volts is applied to the first and second driver control lines DCL21 and DCL22 of the second block driver 310b'. In addition, the same bias as used in the erasing method described in connection with FIG. 5 is applied to the other control lines, i.e., the string control line SCL, the n word control lines W1, W2, W3 ..., and Wn, the ground control line GCL and the m bit lines BL1' through BLm'. As a result, all the cell transistors of the first cell block B1 are erased and have a negative threshold voltage of, for example, about −3 volts.

Next, after erasing all the cell transistors of the first cell block B1, one cell transistor of the first cell block B1, for example, the second cell transistor C112 of the first string S11, will be selectively programmed. More specifically, the first voltage of $V_{PGM}+\alpha$ is applied to the second driver control line DCL12, which is connected to the gate electrode of the second word driver transistor WDT12 controlling the selected cell transistor C112. In addition, the second voltage of $V_{PASS}+\beta$ is applied to the first driver control line DCL11. A voltage of 0 volts is applied to the first and second driver control lines DCL21 and DCL22 of the second block driver 310b', thereby turning off all the driver transistors of the second block driver 310b'. At this time, the same bias as used in the programming method described in connection with FIG. 5 is applied to the other control lines, i.e., the string control line SCL, the n word control lines W1, W2, W3, ..., and Wn, the ground control line GCL and the m bit lines BL1' through BLm'. As a result, only the selected cell transistor C112 is programmed.

The operation of the NAND-type flash memory device of FIG. 7 can be summarized by the following Table 2.

TABLE 2

|  | Erase | Program |
|---|---|---|
| Selected bit line | FLOAT | 0 |
| Unselected bit line | FLOAT | $V_{PI}$ |
| String control line SCL | FLOAT | Vcc |
| Selected word control line $W_i$ | 0 | $V_{PGM}$ |
| $W_{i-1}$ and $W_{i+1}$ | 0 | 0 |
| $W_1$-$W_{i-2}$ and $W_{i+2}$-$W_n$ | 0 | $V_{PASS}$ |
| Ground control line GCL | FLOAT | 0 |
| Common source line CS | FLOAT | 0 |
| First driver control line of selected cell block | Vcc | $V_{PGM} + \alpha$ (or $V_{PASS} + \beta$) |
| Second driver control line of selected cell block | Vcc | $V_{PASS} + \beta$ (or $V_{PGM} + \alpha$) |
| Driver control lines of unselected cell blocks | 0 | 0 |
| Bulk regions | $V_{ERASE}$ | 0 |

Figure 8A:
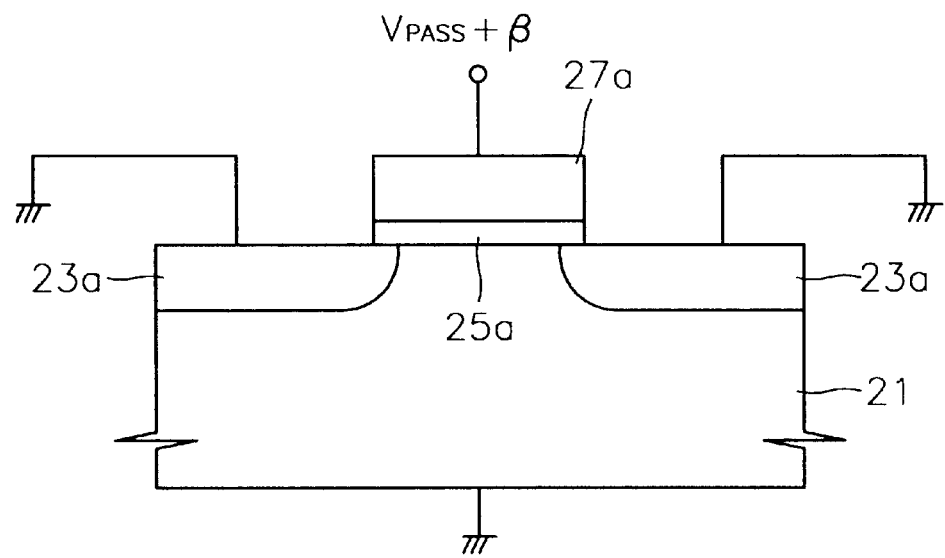
FIGS. 8A and 8B are schematic sectional views showing the worst conditions of a bias which is applied to the driver transistors of FIG. 7.
Figure 8B:
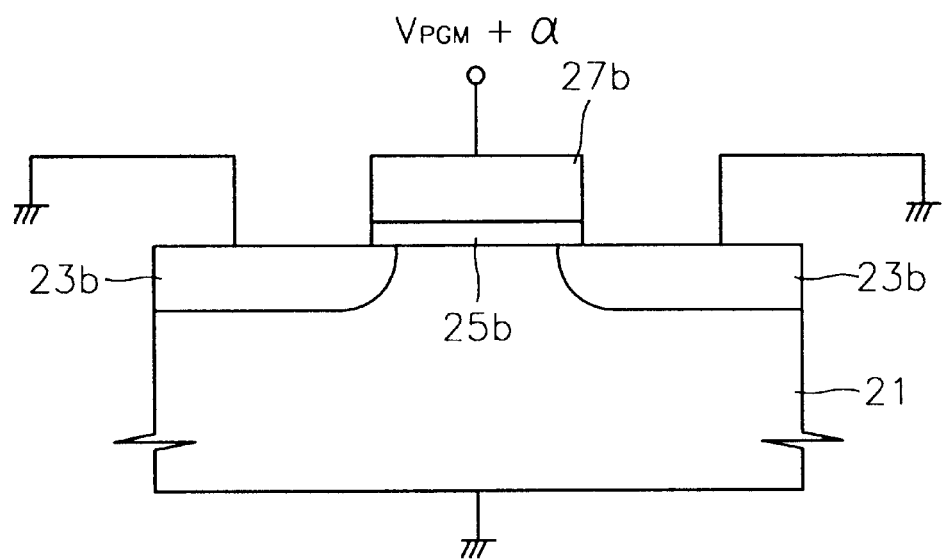

FIGS. 8A and 8B are sectional views showing the worst case conditions in which a bias is applied to the word driver transistors of the first block driver 310a' while the cell transistor C112 of the NAND-type flash memory device of FIG. 7 is being selectively programmed. In other words, FIG. 8A is a sectional view showing a condition in which a bias is applied to the first and third word driver transistors WDT11 and WDT13. FIG. 8B is a sectional view showing a condition in which a bias is applied to the ground driver transistor GDT1.

Referring to FIG. 8A, the second voltage of $V_{PASS}+\beta$ is applied through the first driver control line DCL11 to the gate electrodes 27a of the first and third word driver transistors WDT11 and WDT13 while the cell transistor C112 is selectively being programmed. In addition, a voltage of 0 volts is applied through the first and third word control lines W1 and W3 to the source regions 23a of the first and third word driver transistors WDT11 and WDT13, and is also applied to a bulk region 21. Accordingly, the first and third word driver transistors WDT11 and WDT13 are turned on, and thus the drain regions 23a of the first and third driver transistors WDT11 and WDT13 come to have a voltage of 0 volts. Consequently, an electric field, which is applied to a gate insulating film 25a below the gate electrodes 27a, is considerably lower compared to conventional technology, thereby improving the reliability of the gate insulating film 25a. In other words, according to the present invention, a maximum gate bias applied to the word driver transistors is considerably reduced no matter which cell transistor is selected and programmed.

Referring to FIG. 8B, the first voltage of $V_{PGM}+\alpha$ is applied through the second driver control line DCL12 to the gate electrode 27b of the ground driver transistors GDT1 while the cell transistor C112 is selectively being programmed. In addition, a voltage of 0 volts is applied through the ground control line GCL to the source region 23a of the ground driver transistors GDT1, and is also applied to the bulk region 21. Accordingly, the ground driver transistor GDT1 is turned on, and thus the drain region 23b of the ground driver transistor GDT1 comes to have a voltage of 0 volts. Consequently, an electric field, which is applied to a gate insulating film 25b below the gate electrode 27b, is the same as that in conventional technology. However, the sub-threshold characteristic of the ground driver transistor GDT1 does not directly influence the erasing operation.

Therefore, this embodiment of the present invention can minimize the number of driver control lines in each block driver, thereby maximizing the integration density of NAND-type flash memory devices.

Figure 9:
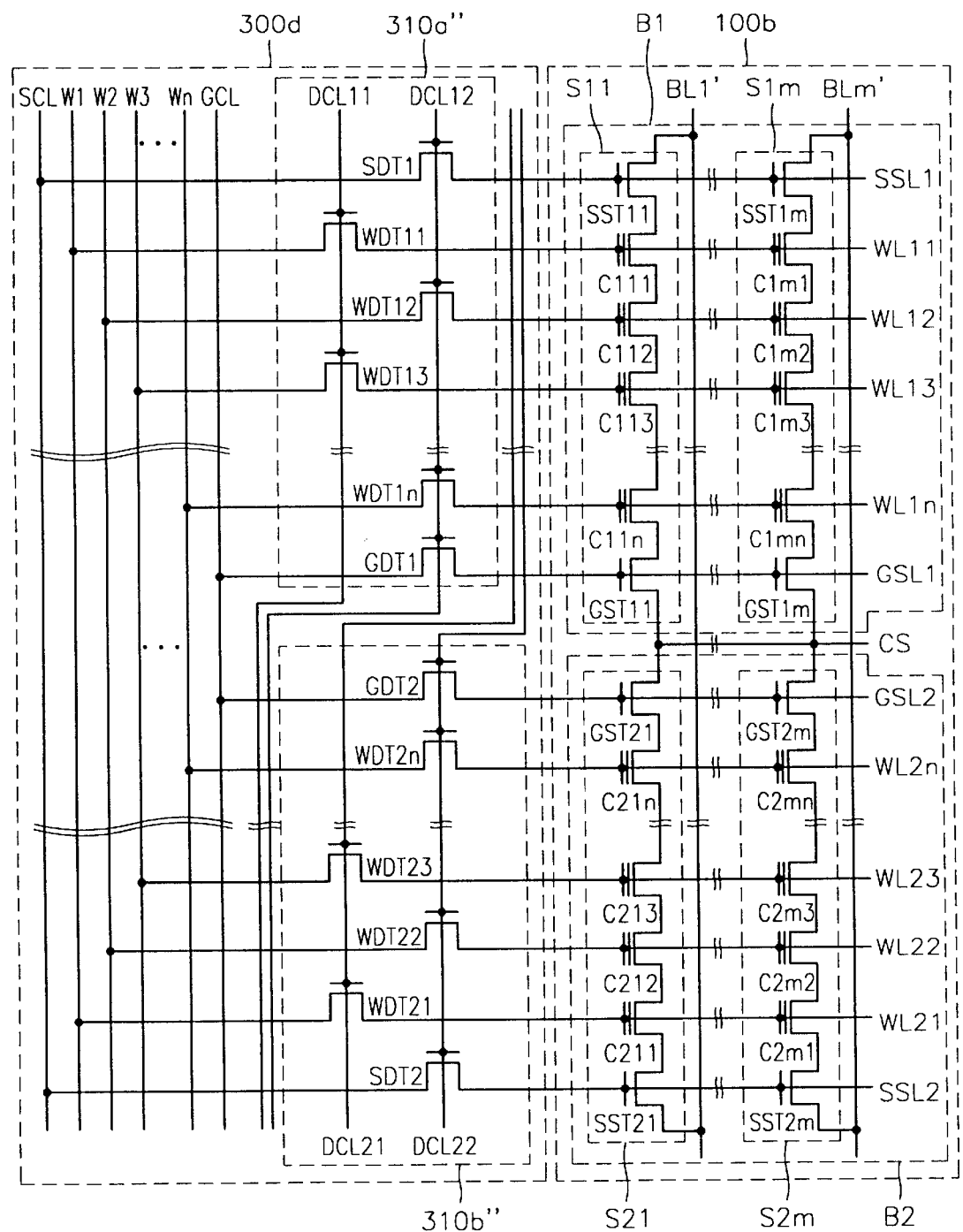
FIG. 9 is a circuit diagram partially showing a row decoder and a cell array area driven by the row decoder in a NAND-type flash memory device according to a third embodiment of the present invention.

FIG. 9 is a circuit diagram illustrating a third embodiment of a NAND-type flash memory device according to the present invention. There is a difference between the third embodiment of FIG. 9 and the second embodiment of FIG. 7 in that the string driver transistor and the ground driver transistor of each block driver are controlled by a second driver control line in the third embodiment of FIG. 9. Moreover, in the modified example of FIG. 9, the string driver transistor and the ground driver transistor of each block driver may be controlled by a first driver control line. The cell array area of FIG. 9 has the same structure as the cell array area of FIG. 5, and thus a description of the cell array area of FIG. 9 will be omitted.

Referring to FIG. 9, a row decoder 300d includes a plurality of block drivers, i.e., first and second block drivers 310a" and 310b". Like the first block driver 310a' of FIG. 7, the first block driver 310a" includes a string driver transistor SDT1, n word driver transistors WDT11, WDT12, WDT13, . . . , and WDT1n and a ground driver transistor GDT1. The first block driver 310a" also includes a first driver control line DCL11, which is connected to the gate electrodes of the odd numbered word driver transistors WDT11, WDT13, . . . , and a second driver control line DCL12, which is connected to the gate electrodes of the even numbered word driver transistors WDT12, WDT14, . . . and to the gate electrodes of the string driver transistor SDT1 and the ground driver transistor GDT1. Alternatively, the gate electrodes of the string driver transistor SDT1 and the ground driver transistor GDT1 may be connected to the first driver control line DCL11.

The second block driver 310b" has the same structure as the first block driver 310a". The gate electrodes of the odd numbered word driver transistors WDT21, WDT23, . . . are connected to a first driver control line DCL21, and the gate electrodes of the even numbered word driver transistors WDT22, WDT24, . . . and to the gate electrodes of the string driver transistor SDT2 and the ground driver transistor GDT2 are connected to a second driver control line DCL22.

The operation of the NAND-type flash memory device of FIG. 9 is the same as that described in FIG. 7, and thus a description thereof will be omitted. In addition, the worst case conditions, in which a bias is applied to the driver transistors of the first block driver 310a" while a certain cell transistor of the NAND-type flash memory device of FIG. 9, for example, the cell transistor C112, is being programmed, are also the same as those described in FIGS. 8A and 8B.

According to the present invention as described above, a gate bias, which is applied to the driver transistors of a driver block connected to each cell block during a programming operation, can be minimized. As a result, the reliability of the driver transistors can be improved, thereby preventing errors from occurring during an erasing operation.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A NAND-type flash memory device comprising:
    a cell array area including a plurality of cell blocks sharing m bit lines, each of the plurality of cell blocks including a string select line, n word lines and a ground select line; and a row decoder including a plurality of block drivers, a string control line, n word control lines and a ground control line, the plurality of block drivers connected to the plurality of cell blocks, respectively, the string control line, n word control lines and the ground control line being connected to the plurality of block drivers, wherein each of the block drivers comprises:

a string driver transistor which is interposed between the string select line of a cell block and the string control line;

n word driver transistors which are interposed between the n word lines of the cell block and the n word control lines, respectively;

a ground driver transistor which is interposed between the ground select line of the cell block and the ground control line;

a first driver control line which is connected to the gate electrodes of the odd numbered word driver transistors among the n word driver transistors;

a second driver control line which is connected to the gate electrodes of the even numbered word driver transistors among the n word driver transistors; and a third driver control line connected to the gate electrodes of the string driver transistor and the ground driver transistor.

2. The NAND-type flash memory device of claim 1, wherein each cell block includes m strings which are connected to the m bit lines, respectively.

3. The NAND-type flash memory device of claim 2, wherein each string comprises a string select transistor, n cell transistors and a ground select transistor, which are sequentially connected to each of the bit lines in series, the gate electrode of the string select transistor being connected to the string select line, the control gate electrodes of the n cell transistors being connected to the n word lines one-to-one, and the gate electrode of the ground select transistor being connected to the ground select line.

4. The NAND-type flash memory device of claim 1, wherein the gate electrode of the string driver transistor is connected to one of the first and second driver control lines.

5. The NAND-type flash memory device of claim 1, wherein the gate electrode of the ground driver transistor is connected to one of the first and second driver control lines.

6. A method of operating a NAND-type flash memory device comprising (i) a cell array area including a plurality of cell blocks sharing m bit lines, each of the cell blocks including m strings, which are connected to the m bit lines, respectively, and a string select line, n word lines and a ground select line, which cross the m bit lines, and (ii) a row decoder including a plurality of block drivers, which are connected to the plurality of cell blocks, respectively, and a string control line, n word control lines and a ground control line, which are also connected to the plurality of block drivers, each of the block drivers comprising (i) a string driver transistor which is interposed between the string select line of a cell block and the string control line, (ii) n word driver transistors which are interposed between the n word lines of the cell block and the n word control lines, respectively, and (iii) a ground driver transistor which is interposed between the ground select line of the cell block and the ground control line, the method comprising the steps of:

selecting one of the m bit lines;

selecting one of the plurality of strings which are connected to the selected bit line;

applying a first voltage higher than a program voltage to one group of the group of the gate electrodes of the odd numbered word driver transistors in a block driver connected to the selected string and the group of the gate electrodes of the even numbered word driver transistors in the block driver connected to the selected string; and applying a second voltage, which is higher than a pass voltage and lower than the program voltage, to the other group of the gate electrodes, to selectively program one of the n cell transistors of the selected string.

7. The method of claim 6, wherein the step of selecting one bit line comprises the steps of:

grounding one bit line of the m bit lines to select the bit line; and applying a program inhibition voltage to unselected bit lines among the m bit lines.

8. The method of claim 7, wherein the program inhibition voltage is the same as a power voltage.

9. The method of claim 6, wherein the step of selecting one string comprises the steps of:

applying a power voltage to the string control line;

grounding the ground control line; and turning on a string driver transistor and a ground driver transistor, which are connected to one of the plurality of strings connected to the selected bit line.

10. The method of claim 9, wherein the step of turning on the string driver transistor and the ground driver transistor comprises the steps of:

applying one of the first and second voltages to the gate electrode of the string driver transistor; and applying one of the first and second voltages to the gate electrode of the ground driver transistor.

11. The method of claim 9, wherein the step of turning on the string driver transistor and the ground driver transistor is implemented by applying a third voltage, which is higher than the power voltage and lower than the second voltage, to the gate electrode of the string driver transistor and to the gate electrode of the ground driver transistor.

12. The method of claim 6, wherein the step of selectively programming one cell transistor comprises the steps of:

selecting a word control line, which is connected to one of the word driver transistors having the gate electrodes to which the first voltage is applied, and applying the program voltage to the selected word control line;

grounding a pair of word control lines which are disposed at both sides of the selected word control line; and applying the pass voltage to remaining word control lines other than the selected word control line and the grounded pair of word control lines among the n word control lines.

13. The method of claim 6, further comprising the step of applying a voltage of 0 volts to the gate electrodes of driver transistors, which are connected to remaining unselected strings other than the selected string among the plurality of strings connected to the selected bit line.

* * * * *